(12) United States Patent
Yap

(10) Patent No.: US 6,285,043 B1
(45) Date of Patent: Sep. 4, 2001

(54) APPLICATION-SPECIFIC OPTOELECTRONIC INTEGRATED CIRCUIT

(75) Inventor: Daniel Yap, Thousand Oaks, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/430,851

(22) Filed: Nov. 1, 1999

(51) Int. Cl.⁷ .................................................. H01L 27/15
(52) U.S. Cl. .................................. 257/81; 257/98; 257/99
(58) Field of Search .................................. 257/81, 99, 98, 257/432, 433, 459, 528

(56) References Cited

U.S. PATENT DOCUMENTS

| | | | |
|---|---|---|---|
| 4,904,036 | * | 2/1990 | Blonder .............................. 350/96.11 |
| 5,138,436 | * | 8/1992 | Koepf ...................................... 357/74 |
| 5,500,910 | * | 3/1996 | Boudreau et al. ..................... 385/24 |
| 5,611,008 | * | 3/1997 | Yap ........................................ 385/14 |

* cited by examiner

Primary Examiner—Nathan Flynn
Assistant Examiner—Remmon R. Fordé
(74) Attorney, Agent, or Firm—Terje Gudmestad

(57) ABSTRACT

An application-specific rf optoelectronic integrated circuit having a generic chip member and a defining substrate in communication with at least one generic chip member. The generic chip member contains passive building block components that are independent from each other and being connected by paths external to the generic chip member. The external connection paths are defined by a defining substrate member having passive components for providing optical and electrical interconnection between selected building block components on the generic chip member to define the specific function of the integrated circuit. It is possible to use the same design of the generic chip for several applications merely by altering the interconnect paths on a defining substrate.

10 Claims, 4 Drawing Sheets

APPLICATION-SPECIFIC OPTOELECTRONIC INTEGRATED CIRCUIT

TECHNICAL FIELD

The present invention relates generally to integrated optoelectronic circuit devices and integrated microwave devices and more particularly to a two-part optoelectronic circuit.

BACKGROUND ART

Optoelectronics pertains to the interaction of electronic processes with optical processes. This interaction is typically associated with energy conversion between electrical signals and optical signals. Optoelectronic devices, such as lasers, photodetectors, optical modulators, and optical switches, are examples of devices within which this interaction takes place.

Integration of optoelectronic/microwave modules has typically followed two paths, hybrid and monolithic. The hybrid integration connects discrete devices with electrical interconnects. Many individual devices are mounted separately on a carrier. Interconnections between the devices are typically accomplished through bond wires or metal paths formed on the carrier substrate. This approach has high flexibility since the devices are selected and interconnected according to the needs of a given application. However, this approach generally results in large circuit size and high parasitics relative to monolithic circuits. The advantage is that semiconductor materials and fabrication processes can be independently selected to enhance the performance of each device.

The hybrid approach is well suited for constructing prototypes. Production can be costly if the circuit contains many devices and interconnections. Additionally, the many separate devices must be tested and mounted individually.

Monolithic integration places all active and passive components on the same substrate. In addition to reducing the overall circuit size, this process reduces parasitic inductances and capacitances because it shortens the length of circuit interconnect structures. Monolithic circuits are typically formed with compound semiconductor families, for example, gallium aluminum arsenide (GaAlAs) and indium phosphide (InP), that inherently facilitate the realization of high resistivity substrates which reduce microwave losses and crosstalk in electrical interconnects.

The monolithic integration approach is particularly suited for high, volume applications. Since many circuit chips can be obtained from a single wafer and several wafers can be processed in a given fabrication run, the cost of a fabrication run is shared among the many units produced. However, each integrated circuit is designed for a specific purpose. Therefore, different applications must be served by designing and fabricating entirely new chips. The tooling cost associated with each new application is high and may not be justifiable when small volumes are needed.

SUMMARY OF THE INVENTION

The present invention facilitates an application-specific rf-optoelectronic circuit by combining at least one generic chip, having common building-block components, with a defining substrate, having application-specific circuit parts and patterns. Thus, the same generic chip can be used in many different applications, and the defining substrate is specific to each application.

The generic chip contains building block components that perform functions such as, but not limited to, optical detection and generation, optical modulation, electrical switching and latching, and electrical amplification. The generic chip can be used in any application due to the fact that paths external to the generic chip connect the building block circuit parts on the generic chip.

The defining substrate consists of passive electronic and microwave components such as, but not limited to, capacitors, inductors, resistors and transmission line elements. These passive components provide electrical and optical interconnection between selected building block components on the generic chip and define the specific function of the combined chip/substrate circuit.

As an example, the components on the defining substrate can determine the gain, frequency response, input/output impedances, logic function, and optical interference according to the needs of a specific application. The defining substrate determines the overall function, so the same generic chip can be used in combination with different versions of defining substrates to perform a variety of application-specific functions.

It is an advantage of the present invention that prototype and production optoelectronic and rf circuits can be rapidly designed and fabricated. Another advantage is the reduced cost associated with using the same generic chip in many different applications. Yet another advantage is the flexibility to meet application specific needs simply by fabricating a defining substrate. Because the defining substrate contains only passive components, its fabrication is fairly quick and easy.

It is an object of the present invention to provide an application specific rf-optoelectronic circuit. It is another object of the present invention to maintain flexibility in the design and fabrication of the application specific rf-optoelectronic circuit. Yet another object of the present invention is to provide a two-part rf-optoelectronic circuit.

A further object of the present invention to use at least one generic chip in combination with a defining substrate, wherein the defining substrate determines the overall function of the circuit. Still a further object of the present invention is to maintain inexpensive and relatively fast fabrication of the application specific defining substrate.

Other advantages, objects and features of the present invention will become apparent when viewed in light of the detailed description of the preferred embodiment when taken in conjunction with the attached drawings and appended claims.

BRIEF DESCRIPTION OF THE DRAWINGS

In order that the invention may be well understood, there will now be described, one or more embodiments thereof, given by way of example, reference being made to the accompanying drawings, in which:

FIG 3b is one example of the defining substrate which when assembled with the generic chip creates the switchable optoelectronic receiver shown in FIG. 3a;

FIG. 4b is another example of the defining substrate which when assembled with the generic chip creates the optoelectronic repeater shown in FIG. 4a.

BEST MODE(S) FOR CARRYING OUT THE INVENTION

Figure 1:
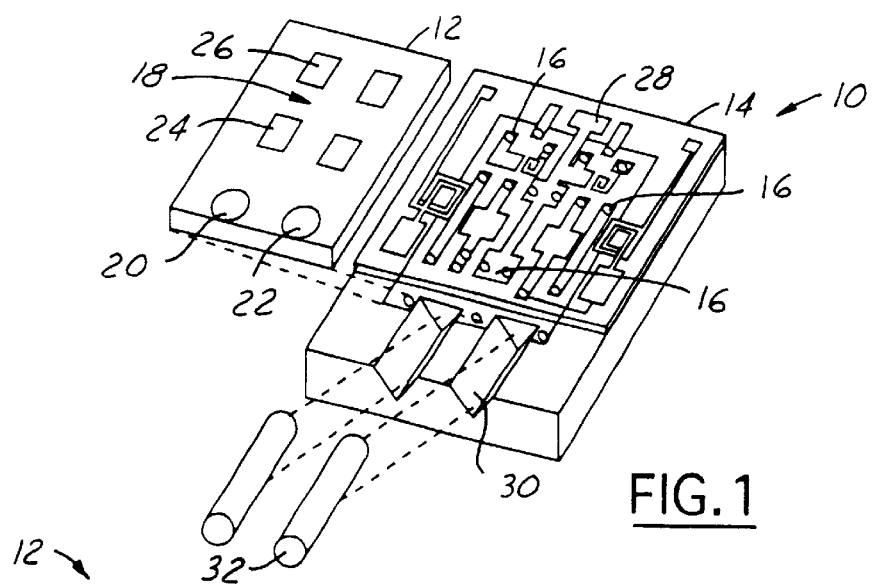
FIG. 1 is an exploded view of the rf-optoelectronic assembly of the present invention showing a generic chip and a defining substrate according to the present invention.

Referring to FIG. 1, there is shown an exploded view of the rf-optoelectronic circuit 10 of the present invention. The circuit 10 has two main segments. One segment is a generic chip 12 that contains building block circuit parts which will be described in greater detail hereinafter. The second segment is a defining substrate 14 that contains application-specific circuit sections. The two segments 12 and 14 are connected together electrically and physically, preferably by means of solder bumps 16, which have small, controllable, and well-characterized parasitics.

The building block circuit parts 18 of the generic device are preferably active devices such as photodetectors, optoelectronic modulators, or light emitters. The building block circuit parts 18 can also be active devices such as amplifier stages, rf switches, logical gates and latches. In FIG. 1, there is shown, by way of example, a photodetector 20, a modulator 22, an input amplifier stage 24 and an output buffer 26. The various building block circuit parts 18 are electrically separate from each other and are preferably interconnected by a path that is external to the generic chip 12.

The second segment of the present invention 10 is the defining substrate 14 that has application-specific circuit sections 28 that are preferably passive components. The circuit sections 28 may be passive microwave components such as transmission lines, resonators, capacitors, inductors, resistors, and tuning stubs. The circuit sections may also be passive optical components such as waveguides, reflectors, and grooves 30 for holding optical fibers 32.

Figure 2:
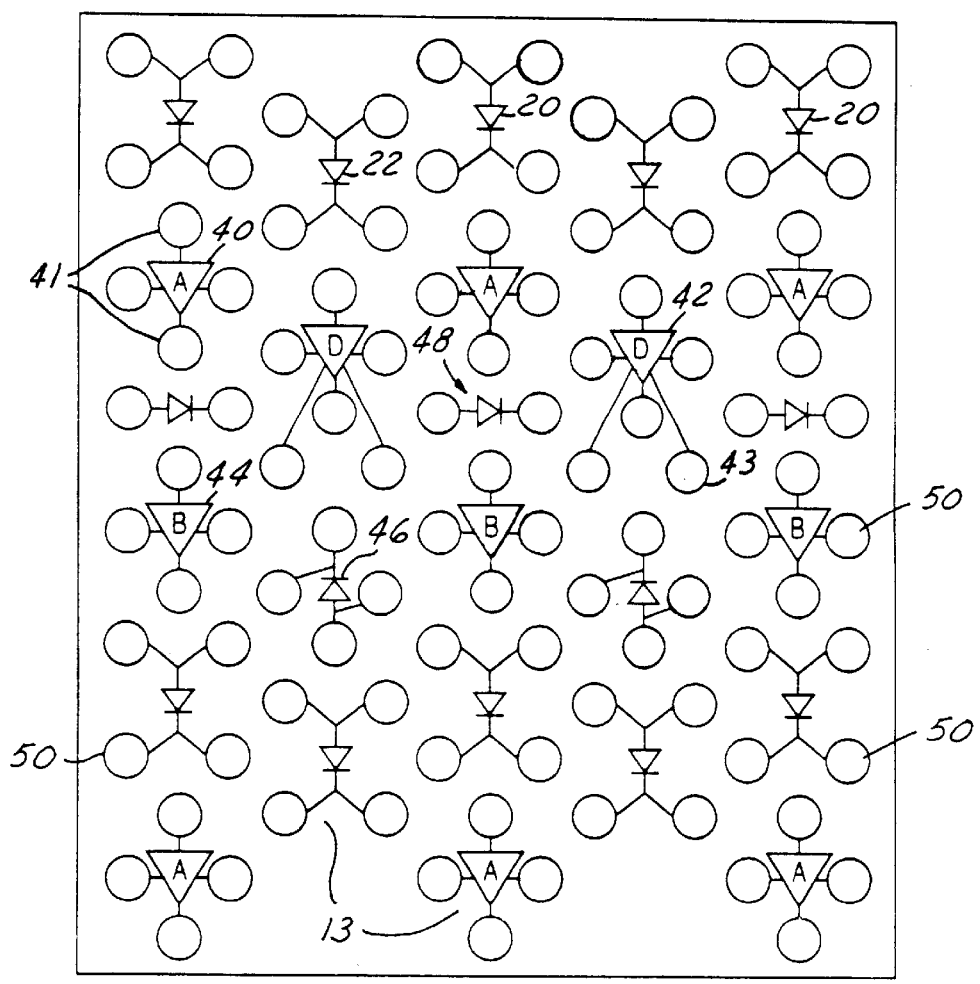
FIG. 2 is an exemplary layout of the building-block components on the generic chip of the Present invention.

Referring now to FIG. 2, an exemplary layout of a generic chip 12 of the present invention is shown. It should be noted that the layout shown is for example purposes only and there are numerous other layouts that are also applicable. In general, the generic chip 12 contains separate building block circuit parts that are dispersed throughout the chip 12 and arranged in a manner appropriate for their combination to form a complete optoelectronic circuit when combined with the defining substrate (not shown).

FIG. 2 shows one of the numerous possible layouts for the generic chip 12 of the present invention. The chip 12 is arranged as an array of individual cells 34. In the present example, one row of cells 34 contains an alternating sequence of photodetectors 20 and modulators 22 for surface-normal optical coupling. Each device has cathode connection points, anode connection points, and ground connection points (not shown). Another row of cells contains transimpedance amplifier blocks 40 and driver blocks 42. The feedback resistance of the amplifier 40 and the current capability or output impedance of the driver 42 are adjusted by means of external connection points, 41 and 43 respectively, on the defining substrate, thereby allowing the generic chip 12 to remain as generic as possible.

Another row of cells 32 contains a buffer stage 44 and two PIN diode switches 46, 48, all having external connection points 50. Each external connection point 50 is shown as a solder-bump compatible pad. The pattern of cells 34, like the one described above, can be repeated many times. Also, other devices, such as waveguide-coupled optoelectronic devices, and other circuit blocks can be included on the generic chip 12 although not shown in the present example.

The generic chip 12 can be fabricated by known methods for monolithically integrating optoelectronic devices such as photodetectors, modulators or lasers with electronic devices such as bipolar transistors and field-effect transistors. Another method for fabricating the generic chip 12 is disclosed in U.S. patent application Ser. No. 09/222,612 which is incorporated herein by reference. U.S. patent application Ser. No. 09/222,612 describes a method for fabricating a monolithic optoelectronic transmitter in which the optoelectronic device and a high-performance electronic device are formed from the same epitaxial layers.

The application-specific defining substrate 14 is described with reference to FIGS. 3a, 3b, 4a and 4b. The substrate 14 is preferably formed from a material that is compatible with the construction of low-loss, high performance passive components. If the circuit carries high-frequency signals, representative substrate materials include alumina, semi-insulating GaAs, high-resistivity silicon and quartz. Passive components are built on the substrate material using conventional, known integrated circuit processing techniques. Representative passive components are transmission lines, (i.e. coplanar waveguides), capacitors, (with, for example, a metal-insulator-metal structure), inductors, (such as spirals), and resistors (made from a thin film of controlled resistivity).

The pattern of circuit components and external connection points on the defining substrate 14 mate with the overall pattern of building blocks on the generic chip 12. Therefore, the layout of the circuit portions on the defining substrate 14 is in three dimensions.

Figure 3A:
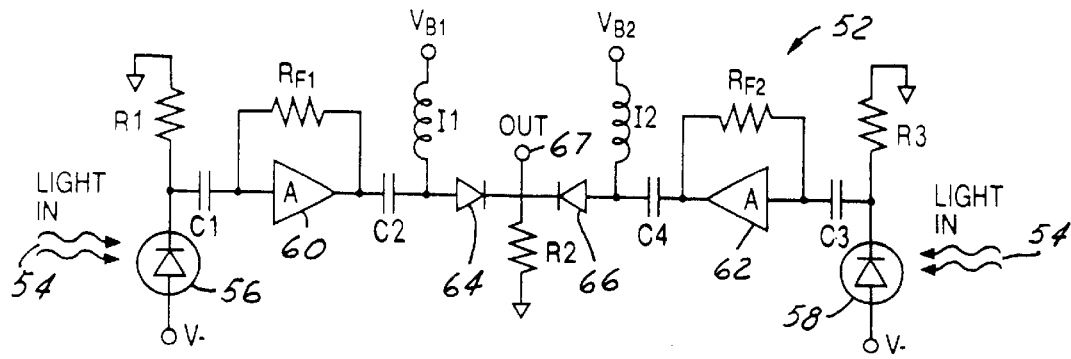
FIG. 3a is a schematic diagram of a switchable optoelectronic receiver.

For example, FIG. 3a is a schematic layout of a 2-to-1 switchable optoelectronic receiver 52. The receiver 52 accepts rf modulated optical signals 54 at optical inputs to two photodetectors 56 and 58. The optical signals 54 are amplified by amplifiers 60 and 62 and sent through PIN switches 64 and 66. Depending on the control voltages to those switches, either or both of the amplified photocurrent signals are sent to an electrical output 67. The photodetectors 56, 58, amplifiers 60, 62 and switches 64, 66 are building block components on the generic chip 12, shown in phantom in FIG. 3b.

The passive components, load resistors, R1, R2, and R3, feedback resistors RF1 and RF2, capacitors C1, C2, C3 and C4, inductors I1 and I2, and output 67 are circuit components on the defining substrate 14. The three dimensional paths between the circuit components on the defining substrate and the building blocks on the generic chip are defined on the defining substrate 14. The electrical paths and passive components define the characteristics for the specific building blocks on the generic chip, creating an application-specific integrated optoelectronic circuit.

Figure 3B:
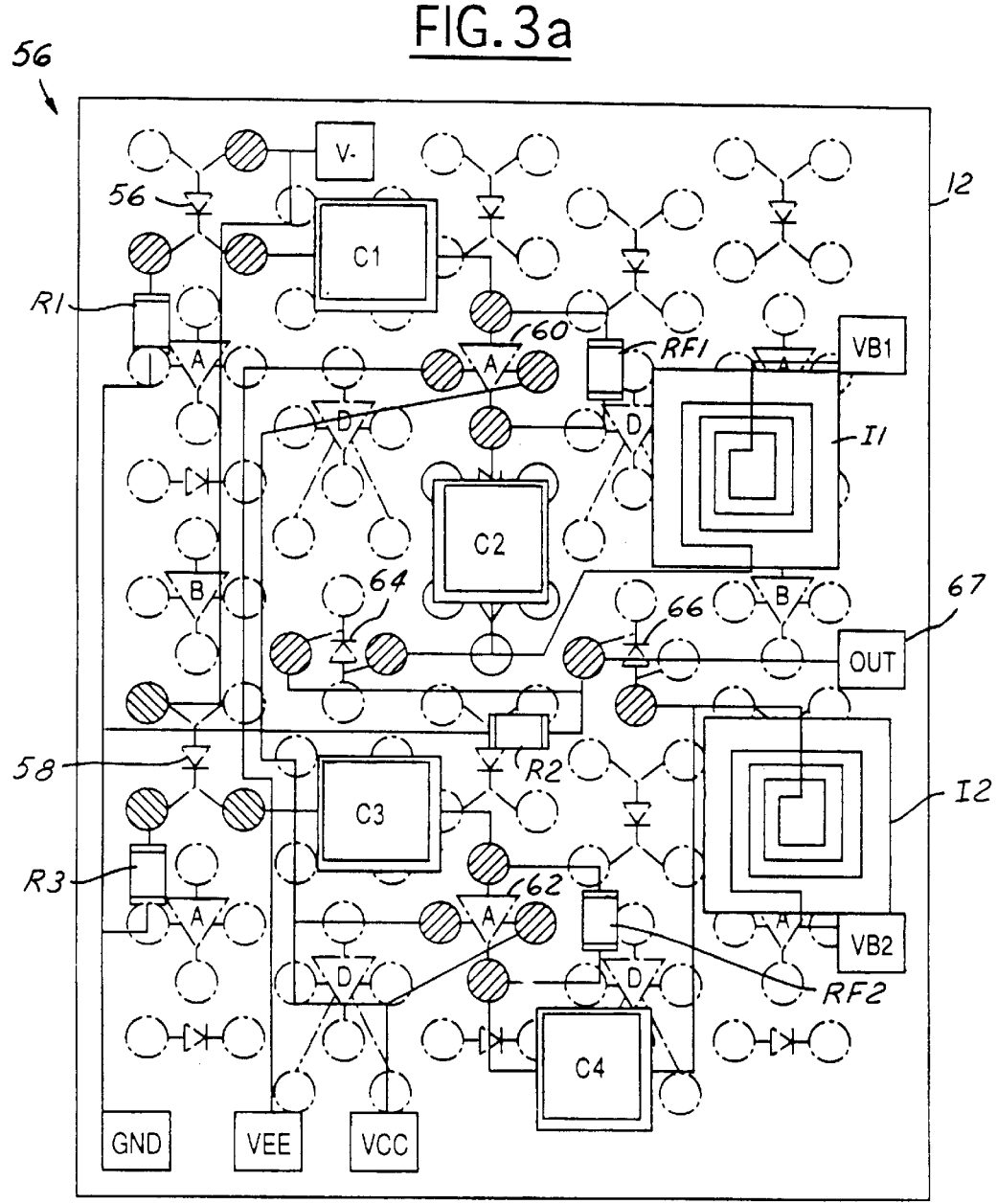

FIG. 3b shows the physical layout of the defining substrate for the optoelectronic receiver 52 as it is aligned with the generic chip. The labels used to describe the components in FIG. 3a are likewise used to describe the components in FIG. 3b to show the correlation between the schematic and the defining substrate pattern. The generic chip 12 is shown in phantom. The paths defined by the substrate 14 are external to the generic chip.

Figure 4A:
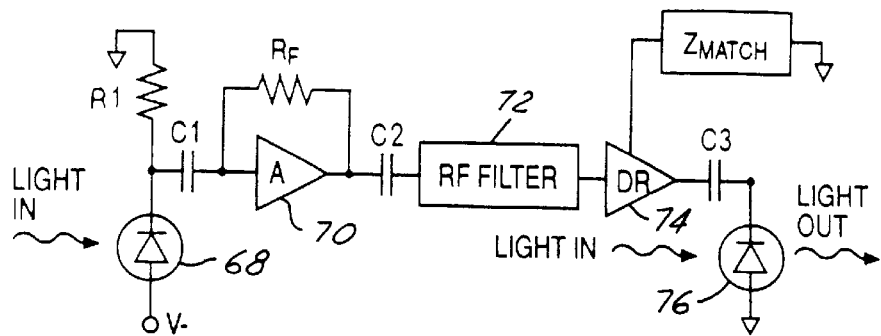
FIG. 4a is a schematic diagram of a optoelectronic repeater.
Figure 4B:
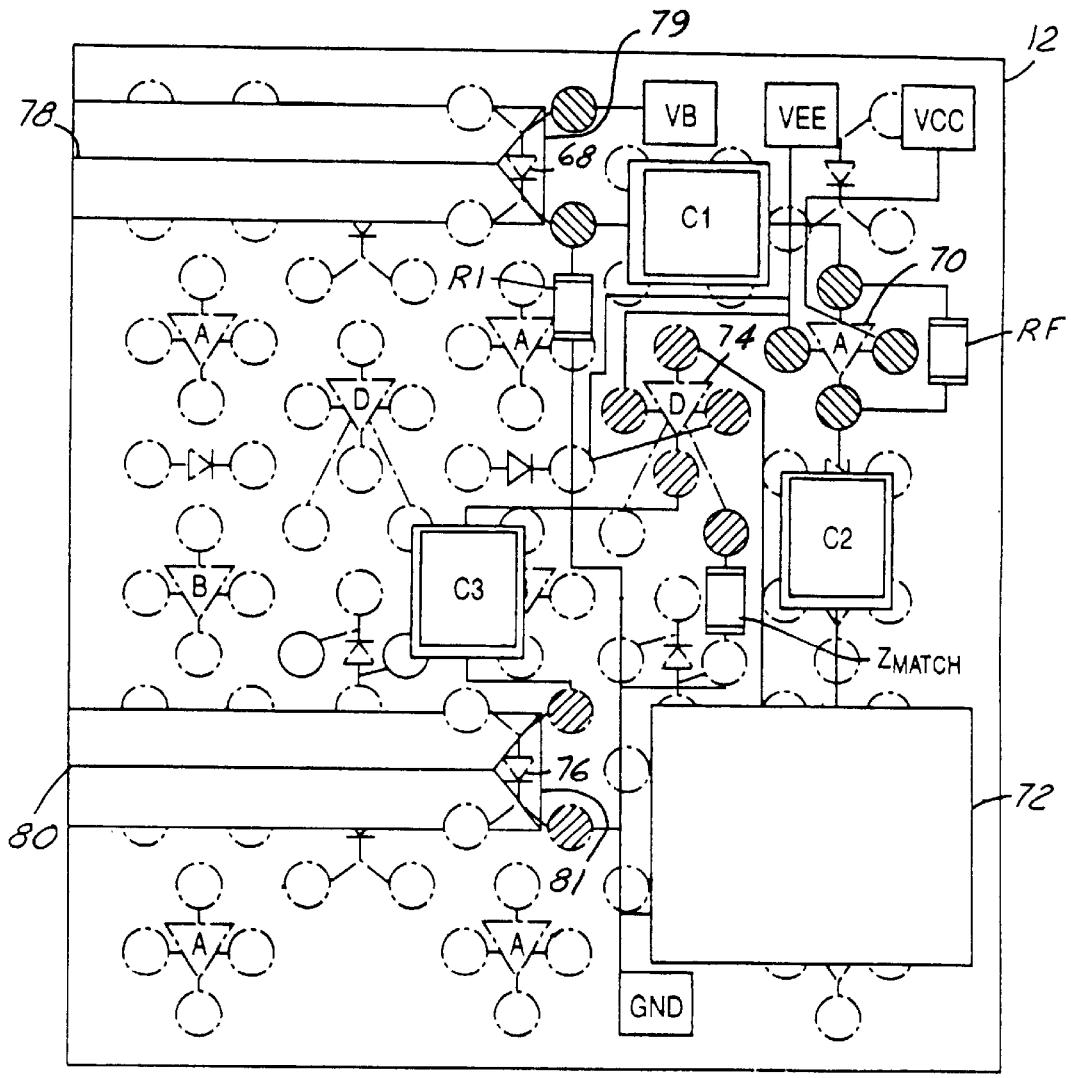

Another example of a defining substrate pattern is shown in FIGS. 4a and 4b. FIG. 4a is a schematic diagram of an optoelectronic repeater. FIG. 4b shows the physical layout of the defining substrate for the repeater as it is assembled with the generic chip (shown in phantom in FIG. 4b). Like reference numbers are used to describe like components in both FIGS. 4a and 4b. The defining substrate contacts an input photodetector 68 on the generic chip 12 to a series connection of a transimpedance amplifier 70, also on the generic chip 12. The amplifier 70 is connected to an rf filter 72 on the defining substrate 14, and a driver 74 on the generic chip 12. An external resistor, $R_F$, on the defining substrate sets the gain of the amplifier 70. The driver 74 modulates an optoelectronic modulator 76 and has its output impedance set by an external component $Z_{MATCH}$ to match the impedance of the modulator 76.

Both the optical input and output are coupled to the appropriate devices of the generic chip through optical fibers (not shown). The defining substrate has grooves 78, 80, preferably V-shaped, with beam-deflecting mirrors 79, 81 at their ends. The grooves 78, 80 are for holding and aligning the fibers (not shown). This example illustrates that not only electrical paths, but also optical paths can be defined by the substrate. It should be noted that in both examples, the defining substrates are mated with the exact same generic chip, illustrating the flexibility of the present invention.

The defining substrate can be fabricated utilizing a method described in U.S. Pat. No. 5,611,008 which is incorporated herein by reference. A low-loss substrate is provided having a dielectric layer over at least a portion of the substrate. Microwave transmission members and passive microwave components are fabricated directly on the dielectric layer.

The interconnections between the generic chip and the defining substrate essentially define the circuit. Performance characteristics that are defined by the combination of the generic chip and the defining substrate are gain, frequency response, logic function, input/output transduction type, and input/output impedance. It is important that the electrical characteristics of the interconnects are accurately characterized and repeatable from one assembly to the next. Preferably, the interconnects are accomplished through a flip-chip assembly with solder or metal bump interconnections. These assembly methods are common practices and will not be discussed in detail herein.

Figure 5:
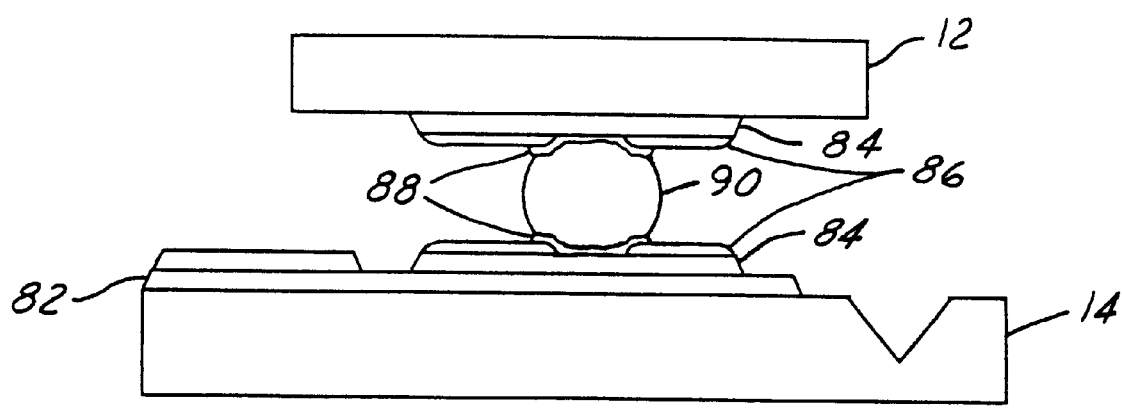
FIG 5 is a side view of the present invention illustrating one embodiment of a connection between the generic chip and the defining substrate.

FIG. 5 illustrates a cross-section of a typical solder-bumped connection. The defining substrate 14 has an insulator layer 82, a metalization layer 84, a solder resistant layer 86 (also known as a dam), and solder bump pads 88. The generic chip has a metalization layer 84, a solder dam 86 and solder bump pads 88. A solder bump 90 contacts the solder bump pads 88 on both the defining substrate 14 and the generic chip 12.

In one fabrication technique, the solder bump 90 is formed as part of the procedure for making the defining substrate 14. The assembly of the combined circuit then consists simply of aligning and placing the generic chip 12 over the substrate 14. The chip 12 and substrate 14 are momentarily heated to reflow the solder, thereby forming the connections. This is an extremely fast assembly process and produces a high yield.

The performance of the physical characteristics of the generic chip's building blocks and the solder bump connections are integral to the overall application-specific circuit design. Therefore, they must be accurately characterized and modeled.

What is claimed is:

1. An integrated circuit comprising:
   at least one chip member having a predefined pattern of building block components arranged thereon, said building block components being separate and independent from each other, said building block components having external connection points; and
   a substrate member in communication with predetermined external connection points of said at least one chip member, said substrate member having a predefined pattern of circuit sections for modifying and selectively connecting selected building block components in said predefined pattern of building block components to each other thereby defining an application-specific integrated circuit.

2. The integrated circuit of claim 1 wherein said circuit sections further comprise passive components.

3. The integrated circuit of claim 2 wherein said passive components are chosen from the group consisting of transmission lines, capacitors, inductors, resistors, resonators, tuning stubs and rf filters, waveguides, reflectors, and means for holding optical fibers.

4. The integrated circuit of claim 3 wherein said means for holding optical fibers further comprises at least one groove for retaining an optical fiber.

5. The integrated circuit of claim 1 wherein said building blocks are active devices.

6. The integrated circuit of claim 5 wherein said active devices are optical devices and electronic devices.

7. The integrated circuit of claim 5 wherein said active devices are chosen from the group consisting of photodetectors, optoelectronic modulators, light emitters amplifier stages, buffers, drivers, switches, logic gates and latches.

8. The integrated circuit of claim 1 wherein said external connection points are solder-bump compatible pads.

9. The integrated circuit of claim 8 wherein a solder bump is disposed between said solder pads thereby defining a connecting path between said building blocks on said chip member and between said substrate member and said chip member.

10. The integrated circuit of claim 9 wherein said solder bump is formed as part of said substrate member.

* * * * *